(12) United States Patent
Lee

(10) Patent No.: US 7,713,774 B2
(45) Date of Patent: May 11, 2010

(54) METHOD OF MANUFACTURING IMAGE SENSOR

(75) Inventor: Joo-Hyeon Lee, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 237 days.

(21) Appl. No.: 11/847,691

(22) Filed: Aug. 30, 2007

(65) Prior Publication Data
US 2008/0064135 A1 Mar. 13, 2008

(30) Foreign Application Priority Data
Sep. 12, 2006 (KR) ...................... 10-2006-0087750

(51) Int. Cl.
*H01L 21/00* (2006.01)
*H01L 21/302* (2006.01)
*H01L 21/461* (2006.01)
(52) U.S. Cl. ................ 438/59; 438/737; 257/E21.616; 257/E21.648
(58) Field of Classification Search ............... 438/59, 438/737, 738, 740; 257/E21.616, E21.648, 257/E21.654, E21.66, E27.133
See application file for complete search history.

(56) References Cited

U.S. PATENT DOCUMENTS

| | | | |
|---|---|---|---|
| 2001/0025970 A1* | 10/2001 | Nozaki et al. | 257/255 |
| 2005/0189606 A1* | 9/2005 | Nakagawa | 257/500 |
| 2005/0280007 A1* | 12/2005 | Hsu et al. | 257/79 |

* cited by examiner

*Primary Examiner*—Walter L Lindsay, Jr.
(74) *Attorney, Agent, or Firm*—Sherr & Vaughn, PLLC

(57) ABSTRACT

Embodiments relate to a method of manufacturing an image sensor which may include forming a gate pattern including a tunnel oxide film, an oxide-nitride-oxide (ONO) film, a floating gate and a control gate over a semiconductor substrate. An oxide film and a nitride film may be formed over the semiconductor substrate including the gate pattern. A photoresist pattern may be formed which covers the oxide film and the nitride film formed over the gate pattern. The nitride film may be etched in a region not covered by the photoresist pattern. The oxide film may be etched to have a predetermined thickness. A deep implant process may deeply implant an N-type dopant into the semiconductor substrate. Ashing and cleaning processes may remove the remaining photoresist pattern.

18 Claims, 3 Drawing Sheets

METHOD OF MANUFACTURING IMAGE SENSOR

The present application claims priority under 35 U.S.C. 119 to Korean Patent Application No. 10-2006-0087750, filed on 19 Sep. 2006, which is hereby incorporated by reference in its entirety.

BACKGROUND

An image sensor converts an optical image into an electrical signal. Image sensors may be classified into complementary metal-oxide-silicon (CMOS) image sensors and charge coupled device (CCD) image sensors. The CCD image sensor may have better photosensitivity and noise characteristics compared with the CMOS image sensor, but may be difficult to fabricate in relatively large scale integration and has higher power consumption than CMOS. In contrast, the CMOS image sensor may have a simpler manufacturing process, leading to higher scale integration, and lower power consumption, compared with CCD image sensors.

Technology for manufacturing the CMOS image sensors has improved, CMOS characteristics have improved, and thus research into CMOS image sensors is ongoing. A pixel of the CMOS image sensor includes photodiodes for receiving light and CMOS components for controlling image signals received from the photodiodes. In the photodiodes, pairs of electrons and holes are generated according to the wavelength and intensity of light of red, green and blue input through color filters and an output signal varies depending on the amount of generated electrons, thereby sensing an image.

A CMOS image sensor may include a pixel region, in which photodiodes may be formed, and a peripheral circuit region for detecting signals generated by the pixel region. The peripheral circuit region may surround the pixel region.

Figure 1:
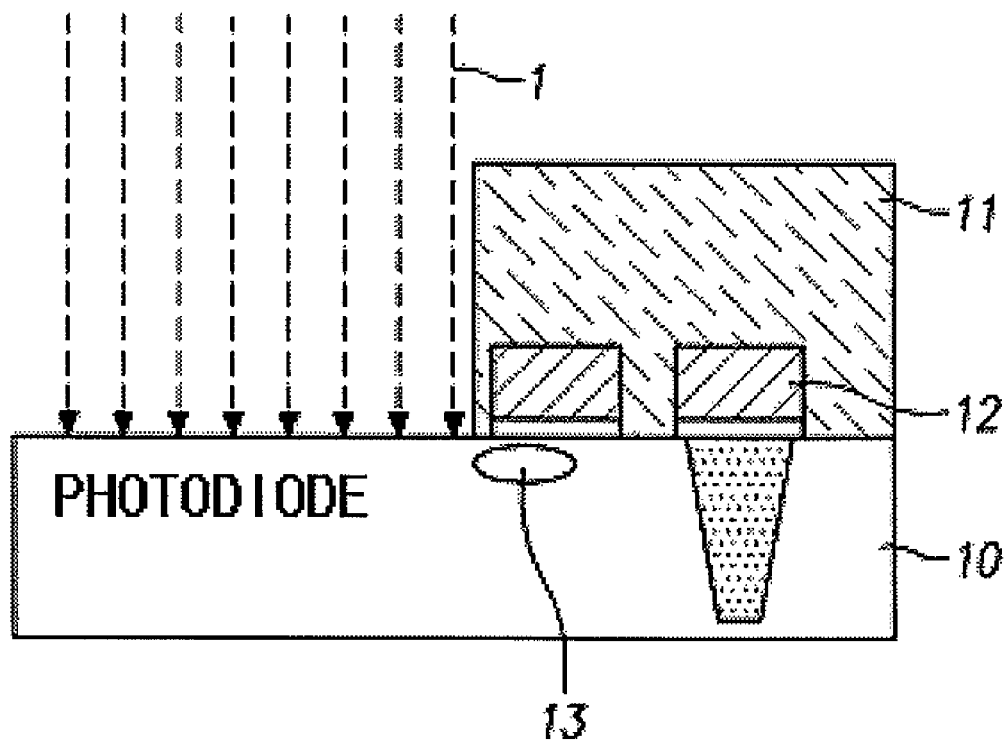

To increase photosensitivity in the CMOS image sensor, a depletion region in a photodiode may be made large. As shown in FIG. 1, an N-type dopant 1 may be ion-implanted at a high energy into a silicon epi layer 10 including a photodiode to deeply form a low-concentration N-type doped region 13.

However, the N-type dopant 1 is implanted at high energy and can sufficiently pass through a gate pattern 12. A gate region cannot be perfectly protected when the N-type doped region 13 is deeply implanted to make the region larger. Thus, the N-type doped region 13 partially overlaps the gate pattern 12 to cause a channeling phenomenon.

The N-type doped region 13 may be made into a source region of a transistor. However, the overlap portion may cause large leakage currents when the CMOS image sensor operates, and a threshold voltage of a transistor located between pixels may not be uniform.

SUMMARY

Embodiments relate to a method of manufacturing an image sensor, which may prevent a channeling phenomenon which occurs when an N-type dopant is ion-implanted at a high energy and uniformly maintaining a threshold voltage. Embodiments relate to a method of manufacturing an image sensor which may include forming a gate pattern including a tunnel oxide film, an oxide-nitride-oxide (ONO) film, a floating gate and a control gate over a semiconductor substrate. An oxide film and a nitride film may be formed over the semiconductor substrate including the gate pattern. A photoresist pattern may be formed which covers the oxide film and the nitride film formed over the gate pattern. The nitride film may be etched in a region not covered by the photoresist pattern. The oxide film may be etched to have a predetermined thickness. A deep implant process may deeply implant an N-type dopant into the semiconductor substrate. Ashing and cleaning processes may remove the remaining photoresist pattern.

DRAWINGS

FIG. 1 shows implantation of an N-type dopant according to a related method of manufacturing an image sensor.

Figure 2:
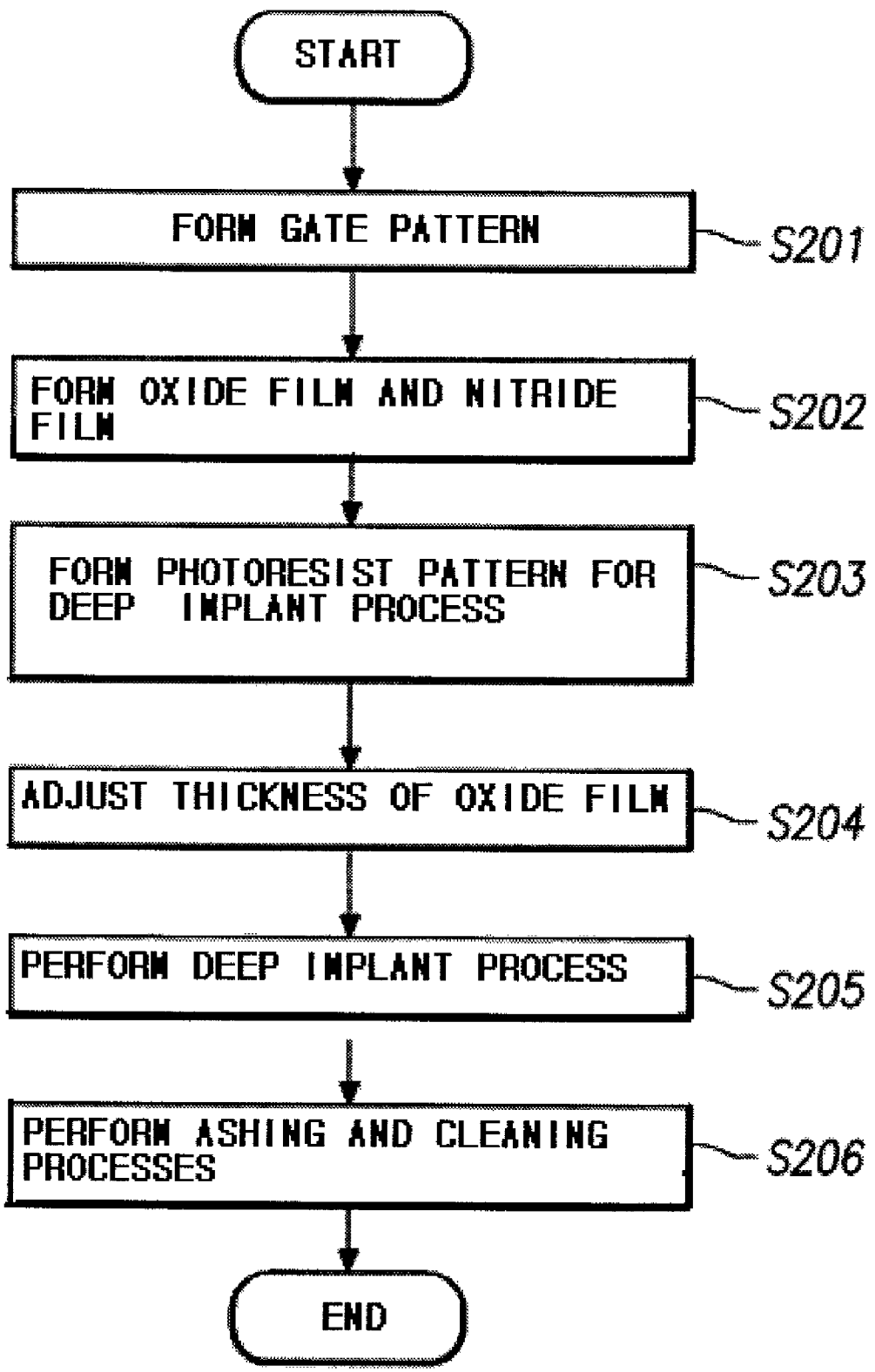

Example FIG. 2 is a flowchart showing a method of manufacturing an image sensor according to embodiments.

Figure 3A:
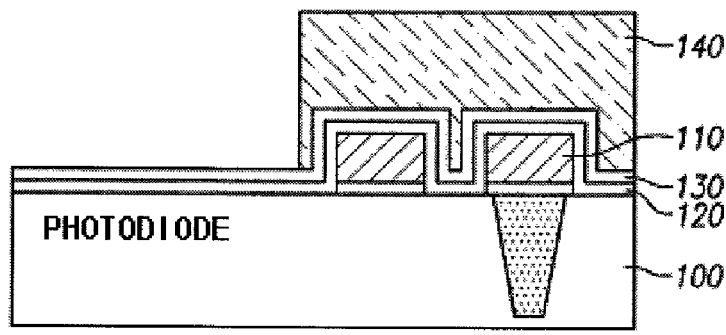
Figure 3B:
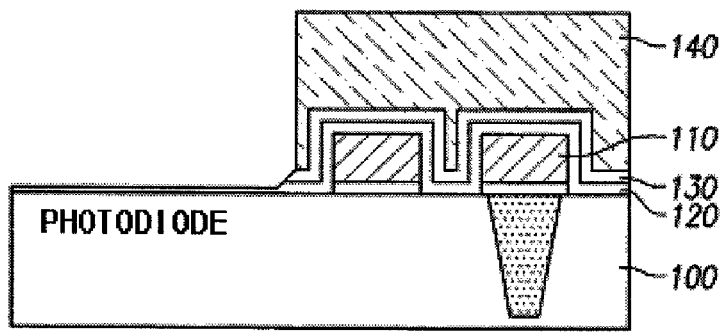
Figure 3C:
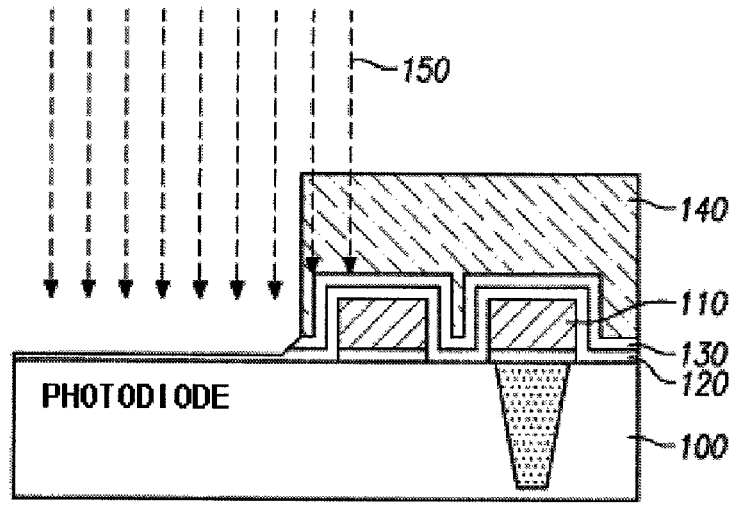

Example FIGS. 3A to 3C are cross-sectional views showing the method of manufacturing the image sensor according to embodiments.

DESCRIPTION

Example FIG. 2 is a flowchart showing a method of manufacturing an image sensor according to embodiments. Example FIGS. 3A to 3C are cross-sectional views showing the method of manufacturing the image sensor according to embodiments. A gate pattern 110 including a tunnel oxide film, an oxide-nitride-oxide (ONO) film, a floating gate and a control gate may be formed over a semiconductor substrate 100 (S201). As shown in example FIG. 3A, an oxide film 120 and a nitride film 130 may be sequentially formed over the gate pattern 110 (S202).

The silicon oxide film 120 may be deposited with a thickness of 1 to 10 nm using a chemical vapor deposition (CVD) method. The silicon nitride film 130 may be deposited over the silicon oxide film with a thickness of about 10 to 300 nm using the CVD method such that the oxide film 120 and the nitride film 130 may function as a hard mask in a subsequent deep implant process using an N-type dopant. The thickness of the nitride film 130 may be set in a range of about 100 to 300 nm according to the condition of the subsequent deep implant process using the N-type dopant.

A photoresist pattern 140 may be formed over the oxide film 120 and the nitride film 130 (S203). More particularly, photoresist may be coated over the semiconductor substrate 100 including the oxide film 120 and the nitride film 130 with a thickness of about 0.85 to 1.5 mm. The photoresist over a region of the semiconductor substrate 100 including the photodiode, that is, a region which may be subjected to the deep implant process using the N-type dopant, is removed. The resulting photoresist pattern 140 which covers the gate pattern 110 is shown in example FIG. 3A.

As shown in example FIG. 3B, the nitride film 130, located in a region exposed by the photoresist pattern 140, may be etched and removed using a wet or dry etching method. The thickness of oxide film 120 may be adjusted to about 20 to 100 Å by etching (S204) to prevent damage due to etching.

After the thickness of oxide film 120 is adjusted, as shown in example FIG. 3C, a deep implant process for implanting an N-type dopant 150 into the region of the semiconductor substrate 100 including the photodiode may be performed (S205). The deep implant process may use an N-type dopant such as phosphorous or Arsenic (As) at an energy of about 70 to 200 KeV and a dose of approximately $1.5 \times 10^{12}$ to $4 \times 10^{12}$ atoms/cm$^2$. The oxide film 120 having a thickness of about 1 to 10 nm and the nitride film 140 having a thickness of about 10 to 300 nm may function as the hard mask in the deep implant process. Accordingly, as shown in example FIG. 3C, the N-type dopant 150 passes through the photoresist pattern 140 and is injected toward the gate pattern 110. The N-type dopant 150 may be prevented from penetrating into a gate poly located below the gate pattern 110 by the oxide film 120 and the nitride film 130.

After the deep implant process for implanting the N-type dopant is performed, an ashing and cleaning processes for removing the photoresist pattern 140 may be performed (S206). Alternatively, before the ashing and cleaning processes for removing the photoresist pattern 140 are performed, the oxide film 120 and the nitride film 130 left in the region which is subjected to the deep implant process may be removed by a wet etching process.

According to embodiments, the oxide film 120 and the nitride film 130 formed over the gate pattern 110 may be used as a hard mask in the deep implant process for implanting the N-type dopant so as to prevent a channeling phenomenon which occurs below the gate pattern 110. Leakage current may be minimized when the image sensor operates, and the threshold voltage of a transistor located between pixel regions may be more uniform.

As described above, according to embodiments, since an oxide film and a nitride film formed over a gate pattern may be used as a hard mask in a deep implant process so as to prevent gate poly channeling which may occur below the gate pattern, leakage current may be minimized when an image sensor operates, and the threshold voltage of a transistor located between pixel regions can be uniformly maintained. Accordingly, the capabilities of the image sensor can be maximized.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming a gate pattern over a semiconductor substrate;
   forming an oxide film over the gate pattern;
   forming a nitride film over the oxide film;
   forming a photoresist pattern over the oxide film and the nitride film;
   etching the nitride film in a region exposed by the photoresist pattern;
   etching the oxide film in a region exposed by the photoresist pattern to a predetermined thickness;
   performing a deep implant process for deeply implanting an N-type dopant into the semiconductor substrate.

2. The method of claim 1, wherein the forming of the oxide film comprises:
   depositing a silicon oxide film with a thickness of about 1 to 10 nm using a chemical vapor deposition method.

3. The method of claim 1, wherein the forming of the photoresist pattern comprises coating photoresist over the semiconductor substrate with a thickness of about 0.85 to 1.5 mm.

4. The method of claim 1, wherein the oxide film is etched to a thickness of approximately 20 Å to 100 Å.

5. The method of claim 1, wherein said performing a deep implant process comprises deeply injecting said N-type dopant at an energy of about 70 to 200 KeV.

6. The method of claim 1, wherein the performing of the deep implant process comprises deeply injecting the N-type dopant into a region of the semiconductor substrate including a photodiode at a dose of approximately $1.5 \times 10^{12}$ to $4 \times 10^{12}$ atoms/cm$^2$.

7. The method of claim 1, comprising performing ashing and cleaning processes for removing the remaining photoresist pattern.

8. The method of claim 1, wherein the forming of the nitride film comprises:
   depositing a silicon nitride film over the silicon oxide film with a thickness of about 10 to 300 nm using a chemical vapor deposition method.

9. The method of claim 1, wherein the region exposed by the photoresist pattern comprises a photodiode.

10. An apparatus configured to:
    form a gate pattern over a semiconductor substrate;
    form an oxide film over the gate pattern;
    form a nitride film over the oxide film;
    form a photoresist pattern over the oxide film and the nitride film;
    etch the nitride film in a region exposed by the photoresist pattern;
    etch the oxide film in a region exposed by the photoresist pattern to a predetermined thickness;
    perform a deep implant process for deeply implanting an N-type dopant into the semiconductor substrate.

11. The apparatus of claim 10, wherein the apparatus is configured to:
    deposit said silicon oxide film with a thickness of about 1 to 10 nm using a chemical vapor deposition method.

12. The apparatus of claim 10, wherein the apparatus is configured to coat said photoresist over the semiconductor substrate with a thickness of about 0.85 to 1.5 mm.

13. The apparatus of claim 10, wherein the apparatus is configured to etch said oxide film to a thickness of approximately 20 Å to 100 Å.

14. The apparatus of claim 10, wherein the apparatus is configured to deeply inject said N-type dopant at an energy of about 70 to 200 KeV.

15. The apparatus of claim 10, wherein the apparatus is configured to deeply inject said N-type dopant at a dose of approximately $1.5 \times 10^{12}$ to $4 \times 10^{12}$ atoms/cm$^2$.

16. The apparatus of claim 10, wherein the apparatus is configured to perform ashing and cleaning processes for removing the remaining photoresist pattern.

17. The apparatus of claim 10, wherein the apparatus is configured to:
    deposit said silicon nitride film over said silicon oxide film with a thickness of about 10 to 300 nm using a chemical vapor deposition method.

18. The apparatus of claim 10, wherein the region exposed by the photoresist pattern comprises a photodiode.

* * * * *